US010126368B2

(12) United States Patent
Rejman et al.

(10) Patent No.: US 10,126,368 B2
(45) Date of Patent: Nov. 13, 2018

(54) INDUCTIVE CHARGING DEVICE

(71) Applicant: Robert Bosch GmbH, Stuttgart (DE)

(72) Inventors: Marcin Rejman, Waiblingen (DE);
Guenter Lohr, Leinfelden-Echterdingen
(DE); Juergen Mack, Goeppingen
(DE); Dragan Krupezevic, Stuttgart
(DE)

(73) Assignee: ROBERT BOSCH GMBH, Stuttgart (DE)

( * ) Notice: Subject to any disclaimer, the term of this patent is extended or adjusted under 35 U.S.C. 154(b) by 1139 days.

(21) Appl. No.: 14/134,628

(22) Filed: Dec. 19, 2013

(65) Prior Publication Data
US 2014/0180612 A1    Jun. 26, 2014

(30) Foreign Application Priority Data

Dec. 21, 2012  (DE) .................. 10 2012 112 959

(51) Int. Cl.
| G01R 31/36 | (2006.01) |
| H02J 7/02 | (2016.01) |
| H02J 50/70 | (2016.01) |
| H02J 50/60 | (2016.01) |
| H02J 50/10 | (2016.01) |
| H02J 5/00 | (2016.01) |

(52) U.S. Cl.
CPC .......... *G01R 31/3627* (2013.01); *H02J 5/005* (2013.01); *H02J 7/025* (2013.01); *H02J 50/10* (2016.02); *H02J 50/60* (2016.02); *H02J 50/70* (2016.02)

(58) Field of Classification Search
CPC ........ G01R 31/3627; H02J 5/005; H02J 7/025
See application file for complete search history.

(56) References Cited

U.S. PATENT DOCUMENTS

| 7,065,658 B1* | 6/2006 | Baraban ................ G06F 1/1626 |
| | | 320/108 |
| 2012/0236903 A1* | 9/2012 | Rejman .................. H02J 7/047 |
| | | 374/152 |
| 2013/0162220 A1* | 6/2013 | Iijima ................... H02J 7/0052 |
| | | 320/137 |
| 2013/0163635 A1* | 6/2013 | Karanth ................. H02J 5/005 |
| | | 374/45 |
| 2014/0191715 A1* | 7/2014 | Wechlin ................ B60L 11/182 |
| | | 320/108 |

FOREIGN PATENT DOCUMENTS

| CN | 1954472 A | 4/2007 |
| CN | 101924385 A | 12/2010 |
| DE | 102011050655 A1 * | 11/2012 | ............ B60L 11/182 |

* cited by examiner

Primary Examiner — Mohamed Charioui
Assistant Examiner — Jeremy Delozier
(74) Attorney, Agent, or Firm — Norton Rose Fulbright US LLP; Gerard Messina

(57) ABSTRACT

An inductive charging device for a handheld machine tool storage battery device includes at least one foreign-object detection unit having at least one operating time counter and at least one compensating unit. The compensating unit sets and/or adapts at least one foreign-object detection parameter of the foreign-object detection unit as a function of an operating time t.

7 Claims, 4 Drawing Sheets

INDUCTIVE CHARGING DEVICE

BACKGROUND OF THE INVENTION

An inductive charging device, especially an inductive charging device for a storage battery of a handheld machine tool, which includes at least foreign object detection unit, has already been proposed.

BRIEF SUMMARY OF THE INVENTION

The present invention is based on an inductive charging device, especially an inductive charging device for the storage battery of a handheld machine tool, which encompasses at least one foreign object detection unit.

It is proposed that the foreign object detection unit include at least one operating time counter and at least one compensating means, which is provided to set and/or adapt at least one foreign object detection parameter of the foreign object detection unit as a function of an operating time. In this context, an 'inductive charging device' in particular refers to a device for charging storage battery devices, especially accumulators. The device preferably has at least one control and/or regulator unit for controlling and/or regulating a charging operation. In especially preferred manner, it refers to a charging device which is to transmit charge energy to at least one storage battery device in inductive manner during a charging operation. A 'charging operation' specifically means an operating state in which the storage battery device is supplied with energy from the outside. Preferably, it describes an operating state in which the storage battery device temporarily stores externally supplied energy. In this context, a 'storage battery charging device for a handheld machine tool' furthermore specifically denotes a charging device provided for charging a storage battery device of a handheld machine tool. A 'storage battery device for a handheld machine tool' in particular is an accumulator device for a handheld machine tool. A 'storage battery device' in particular describes a device for the temporary storage of electrical energy, in particular an accumulator. Preferably, it refers to a rechargeable accumulator, in particular. A variety of storage battery devices that appear useful to the expert are conceivable; however, it specifically refers to a lithium-ion accumulator. Moreover, a 'handheld machine tool' in particular describes a machine that processes work pieces, but advantageously refers to a power drill, a drill and/or hammer drill, a saw, a planer, a screw device, a lathe, a polisher, an angular grinder, a garden tool and/or a multi-function tool. In addition, a 'foreign object detection unit' in particular means a unit provided to detect foreign objects, in particular in an environment of the inductive charging device and/or in an environment of the storage battery device. Preferably, it is meant to describe a unit for detecting foreign objects situated in a contact region between the inductive charging device and the storage battery device, which foreign object may have an adverse effect on a charging process in a charging operation. 'Foreign objects' in particular are metallic and/or magnetic components, segments or other objects. An 'operating time counter' in this context specifically describes an element and/or part of a processing unit provided to record a current, especially a previous, operating time.

Furthermore, a 'compensating means' in this context in particular describes an element and/or at least part of a processing unit which has an operating system and/or at least one computing routine provided to compensate for a change in a parameter, by setting and/or adjusting an additional parameter or the parameter itself. 'Provided' in particular means specially programmed, configured and/or equipped. Furthermore, a 'foreign object detection parameter' in particular refers to a parameter that is at least partially utilized and/or analyzed to detect a foreign object. Preferably, this may mean both a sensed and/or detected parameter and/or a calculated intermediate parameter, in particular.

As a result of the development of the inductive charging device according to the present invention, it is possible to make available an especially advantageous foreign object detection, in which an operating time is taken into account, in particular. Especially the ageing of components may be considered in this manner.

It is furthermore the case that the inductive charging device is equipped with a primary inductive charging unit having an electronic charging unit, which is equipped with at least one oscillating circuit for the direct transmission of energy. More specifically, a 'primary inductive charging unit' refers to an inductive charging unit which is provided to convert electrical energy into a magnetic field, which is able to be reconverted into electrical energy by a secondary inductive charging unit, in particular. Specifically, an 'inductive charging unit' describes a unit provided for the purpose of converting electrical energy into a magnetic field, or for converting a magnetic field into electrical energy. Preferably, it denotes a part of an inductive charging unit provided to transmit energy from a charging device to a storage battery device, in particular in at least partially contactless manner, by way of induction. Especially preferably, the inductive charging unit includes at least one charge coil. A 'charge coil' in particular describes an element which is at least partially made up of an electrical conductor, especially a coiled electrical conductor, which is at least partially disposed in the form of a circular disk. When applying a magnetic field, a voltage is preferably induced in the electrical conductor. Furthermore, an 'electronic charging unit' in particular refers to an electronic unit provided to influence at least one charge parameter, such as a charge voltage and/or a charge current, in particular. In this context, an 'electronic unit' in particular refers to a unit which influences at least an electrical current in a gas, in a conductor, in a vacuum and/or advantageously, in a semiconductor. Preferably, the electronic unit includes at least one electronic component. Various electronic components that seem useful to one skilled in the art are conceivable, such as a capacitor, a resistor, and/or a diode. In this context, an 'oscillating circuit' in particular describes a circuit which is able to resonate. Preferably, it specifically describes a circuit having at least one coil and at least one capacitor. A 'circuit' is an electronic circuit, in particular. Preferably, it describes a combination of electrical and/or electronic components, in particular. Furthermore, 'for the direct transmission of energy' in particular means that at least one part of the oscillator circuit is provided to inductively transmit charge energy directly to the storage battery device. It preferably means, in particular, that at least a portion of the oscillator circuit is directly provided to convert electrical charge energy for transmission to the storage battery device into a transitional energy form, especially into a magnetic field. This makes it possible to provide a particularly advantageous inductive charging device, especially as far as the detection of a foreign object is concerned. Furthermore, the oscillator circuit makes it possible to realize an especially advantageous energy transmission.

It is furthermore the case that the foreign object detection unit is provided to compare a setpoint quality with an actual quality of the oscillator circuit. A 'setpoint quality' in this context especially refers to a theoretical, optimal quality of the oscillator circuit in a charging operation, as it theoretically occurs in optimal positioning of the battery storage device on the inductive charging device and/or in the absence of foreign objects. In addition, an 'actual quality' in this context in particular means an actual quality of the oscillator circuit during a charging operation. A 'quality of the oscillator circuit' in particular describes a factor which describes damping of the resonant oscillator circuit. Preferably, it means especially a ratio between an energy that is stored in the oscillator circuit and an energy loss. In this way a particularly advantageous detection of foreign objects is made possible.

It is furthermore the case that the foreign object detection unit is provided to compare a quality differential between the setpoint quality and the actual quality with a permissible quality differential. This results in an especially advantageous foreign object detection. It is furthermore possible to provide a particularly reliable foreign object detection via a quality differential.

It is moreover the case that the compensating means is provided to set and/or adapt and/or to calculate at least one quality parameter as a function of an operating time. This specifically makes it possible to realize a permanently reliable foreign object detection. Especially a quality parameter that varies over time is thereby able to be compensated, so that the precision with which foreign objects are detected is able to be kept at a constant level.

It is furthermore the case that the compensating means is provided to set and/or adapt a setpoint quality of the foreign object detection unit as a function of an operating time. This enables a permanently reliable foreign object detection. More specifically, by setting and/or adapting the setpoint quality, it is possible to compensate for an average actual quality that changes over time, thereby keeping the precision with which foreign objects are detected at a constant level.

It is furthermore the case that the compensating means is provided to set and/or adapt a permissible quality differential of the foreign object detection unit as a function of an operating time. In this way a permanently reliable foreign object detection is made possible. In particular, an average actual quality that varies over time and a quality differential that varies as a result is able to be compensated by setting and/or adapting the permissible quality differential, so that the precision at which foreign object are detected is maintainable at a constant level.

In addition, a method is provided for detecting foreign objects by means of the foreign object detection unit of the inductive charging device, in which a quality differential between a setpoint quality and an actual quality of an oscillator circuit is detected and this quality differential is compared with a permissible quality difference. Using the method of the present invention for detecting foreign objects via the foreign object detection unit of the inductive charging device, an especially advantageous foreign object detection is able to be made available, in which foreign objects are detected in especially reliable manner and an operating time is able to be taken into account in addition. Ageing of components, in particular, is able to be considered.

The inductive charging device according to the present invention and the system of the present invention are not to be restricted to the a fore-described use and specific developments. In particular, in order to achieve the method of functioning described herein, the inductive charging device according to the present invention and the system of the present invention may have a number of individual elements, components and units that deviates from the number indicated in this text.

DETAILED DESCRIPTION OF THE INVENTION

Figure 1:
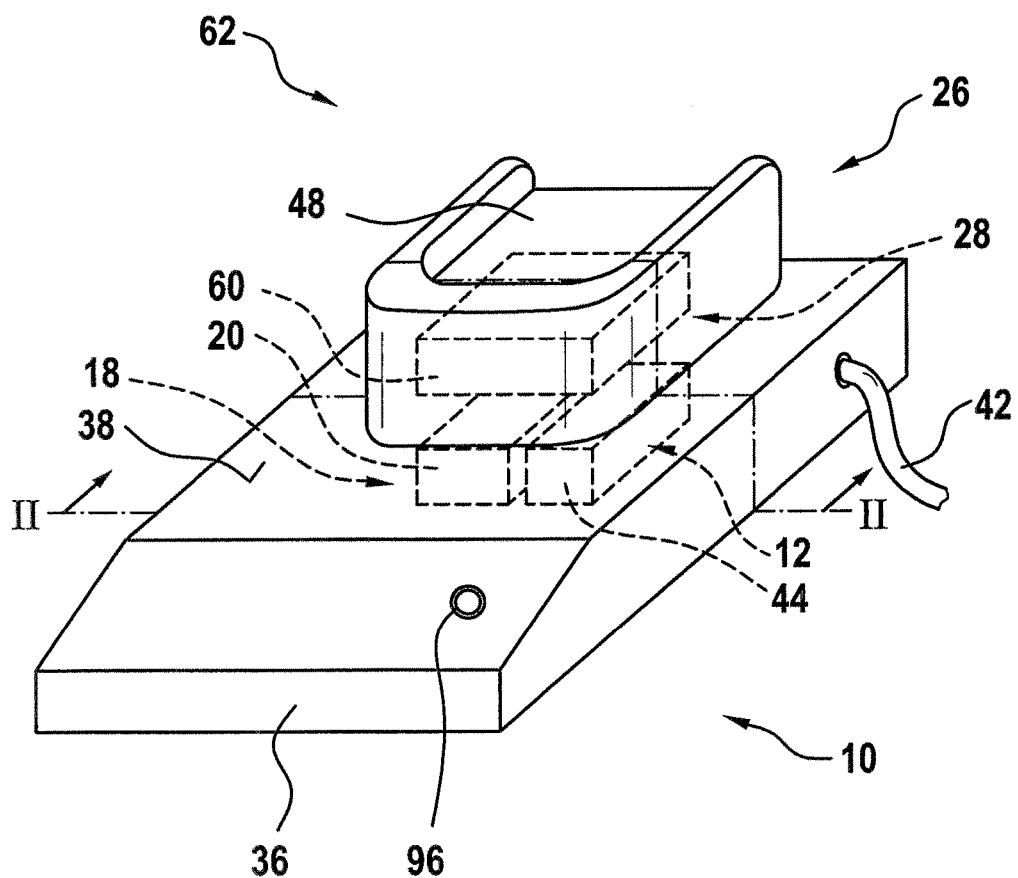
FIG. 1 shows a schematic view of an inductive charging device according to the present invention, having a primary inductive charging unit and a foreign object detection unit as well as a storage battery device, in a charging operation.

FIG. 1 shows an inductive charging device 10 according to the present invention in a charging operation, the device having a primary inductive charging unit 18 and a foreign object detection unit 12 as well as a storage battery device 26. Inductive charging device 10 is formed by an inductive charging device of a handheld machine tool storage battery. Inductive charging device 10 is provided to inductively transmit charge energy to storage battery device 26 during a charging operation. Inductive charging device 10 includes primary inductive charging unit 18. Primary inductive charging unit 18 is provided to transmit energy from inductive charging device 10 to storage battery device 26 in wireless manner. Primary inductive charging unit 18 converts electrical energy into a magnetic field, which is able to be reconverted into electrical energy by a secondary inductive charging unit 28 of storage battery device 26. Primary inductive charging unit 18 includes an electronic charging unit 20. Furthermore, primary induction charge unit 18 has a charge coil 30 and a core unit 32. Charge coil 30 has a ring-shaped form. Charge coil 30 is made up of a plurality of electrical conductors that extend in the circumferential direction. The electrical conductors are wound around a winding axis 34 in the circumferential direction. Core unit 32 is plate-shaped and made from a magnetic material. In addition, inductive charging device 10 includes a housing unit 36. Primary inductive charging unit 18 and foreign object detection unit 12 are disposed inside housing unit 36 in their entirety.

Storage battery device 26 is placed on a charge surface 38 of inductive charging device 10 during a charging operation. Charge surface 38 constitutes a section of housing unit 36 of inductive charging device 10. Charge surface 38 extends in a provided stand parallel to a base surface and faces away from a base surface. Charge surface 38 is provided to accommodate storage battery device 26 for a charging operation. Starting from charge surface 38 of housing unit 36 and viewed in the direction of a center of inductive charging device 10, charge coil 30 of primary inductive charging unit 18 comes first, followed by core unit 32 of primary inductive charging unit 18, a shielding unit 40, and electronic charging unit 20 of primary inductive charging unit 18. Shielding unit 40 protects electronic charging unit 20 from interference effects of charge coil 30, and vice versa. Electronic charging unit 20 is connected to a cable 42 for the energy supply (not shown further).

Electronic charging unit 20 of primary inductive charging unit 18 has an oscillator circuit 22 for the direct transmission of energy. Oscillator circuit 22 is provided to transmit energy directly to storage battery device 26. Charge coil 30 of primary inductive charging unit 18 constitutes part of oscillator circuit 22.

Foreign object detection unit 12 is provided to compare a setpoint quality $Q_S$ with an actual quality $Q_I$ of oscillator circuit 22. Foreign object detection unit 12 compares a quality differential $\Delta Q_I$ between setpoint quality $Q_S$ and actual quality $Q_I$ with a permissible quality differential $\Delta Q_S$. For the foreign object detection, foreign object detection unit 12 records a quality differential $\Delta Q_I$ between setpoint quality $Q_S$ and actual quality $Q_I$ of oscillator circuit 22 and compares it with permissible quality differential $\Delta Q_S$. Foreign object detection unit 12 has a operating time counter 14 and a compensating means 16. Compensating means 16 is provided to adapt a foreign object detection parameter of foreign object detection unit 12 as a function of an operating time t. Compensating means 16 adapts a quality parameter as a function of operating time t. Compensating means 16 is provided to adapt a quality parameter as a function of an operating time t recorded by operating time counter 14, in order to compensate for ageing of an oscillator circuit component 46 of oscillator circuit 22 in a foreign object detection. Compensating means 16 is able to adapt setpoint quality $Q_S$ of foreign object detection unit 12 as a function of operating time t. Furthermore, compensating means 16 is able to adapt permissible quality differential $\Delta Q_S$ of foreign object detection unit 12 as a function of operating time t. In addition, compensating means 16 may adapt calculated quality differential $\Delta Q_I$ of foreign object detection unit 12 as a function of operating time t.

Foreign object detection unit 12 is provided with a processing unit 44. Compensating means 16 of foreign object detection unit 12 is part of processing unit 44. Compensating means 16 forms a computing routine of processing unit 44. Operating time counter 14 forms part of processing unit 44 as well.

Furthermore, foreign object detection unit 12 includes an output element 96. Output element 96 is formed by an LED. Information from foreign object detection unit 12 is able to be output to an operator via output element 96. Output element 96 outwardly projects through an opening of housing unit 36 of inductive charging device 10.

Figure 2:
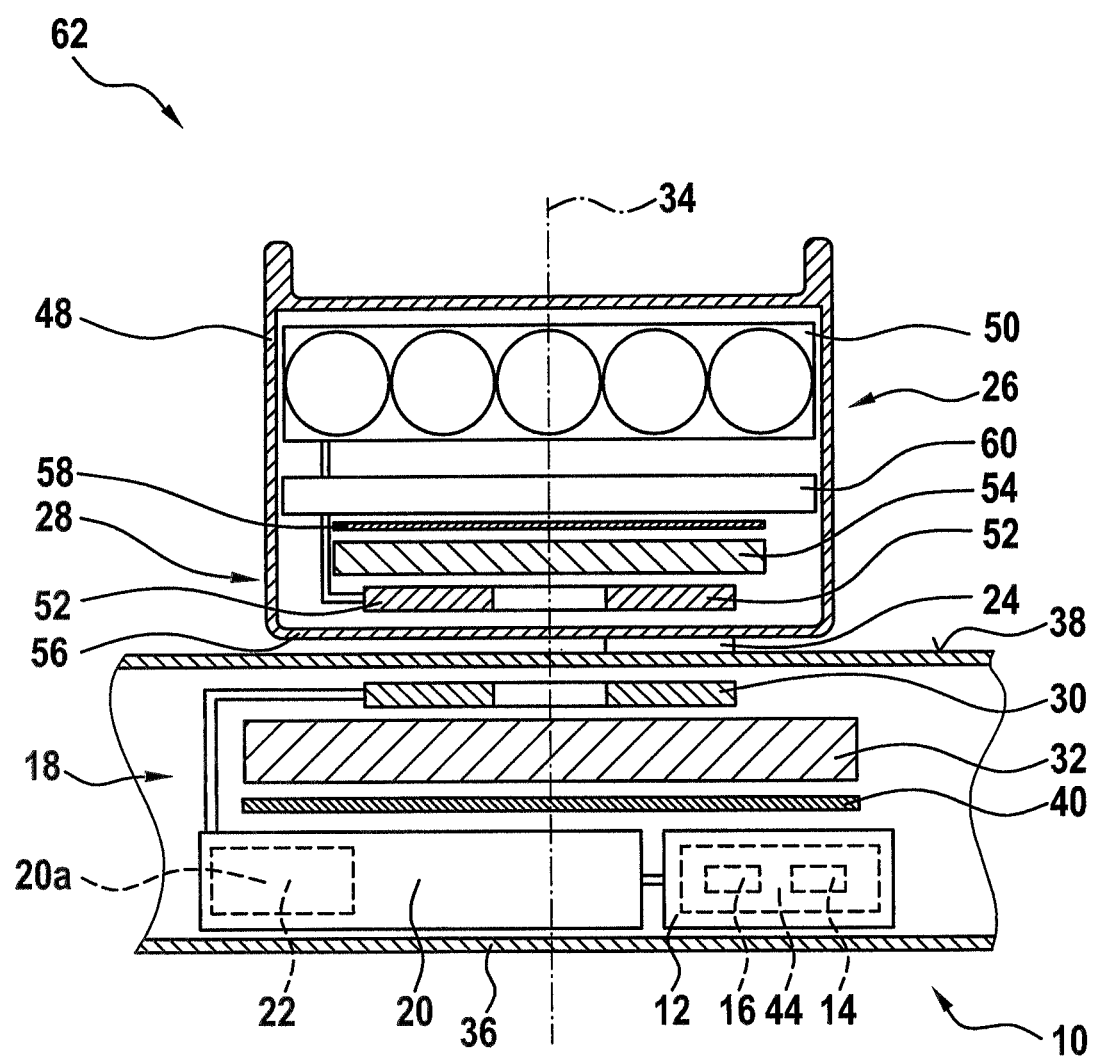
FIG. 2 shows a subsection of the inductive charging device according to the present invention and of the storage battery device, in a schematic sectional view along sectional line II.

Storage battery device 26 is formed by a storage battery device of a handheld machine tool. Storage battery device 26 has a housing unit 48. In addition, storage battery device 26 includes a cell unit 50 and secondary inductive charging unit 28. Cell unit 50 is provided for energy storage. Furthermore, cell unit 50 supplies a handheld machine tool (not shown further) with energy. Cell unit 50 is accommodated in housing unit 48. Secondary inductive charging unit 28 of storage battery device 26 is provided to charge cell unit 50. Secondary inductive charging unit 28 is provided for the wireless transmission of energy for a charging operation of cell unit 50. Secondary inductive charging unit 28 has a charge coil 52 and a core unit 54. Charge coil 52 is developed in the form of a ring and made up of a plurality of electrical conductors which extend in the circumferential direction. The electrical conductors are wound around winding axis 34 (FIG. 2) in the circumferential direction. Core unit 54 is developed in plate form and made from magnetic material. Secondary inductive charging unit 28 is situated between cell unit 50 and a housing wall 56 of housing unit 48. Starting at housing wall 56, viewed in the direction of cell unit 50, charge coil 52 of secondary inductive charging unit 28 is encountered next, followed by core unit 54 of secondary inductive charging unit 28, a shielding unit 58, and an electronic unit 60 of secondary inductive charging unit 28. Shielding unit 58 is provided to protect electronic unit 60 from interference effects of charge coil 52, and vice versa. Electronic unit 60 forms an electronics charger and is connected to charge coil 52 via a line, and to cell unit 50 via a line (FIG. 2).

A foreign object 24 is situated between storage battery device 26 and inductive charging device 10. Foreign object 24 is disposed in a region between housing wall 56 of storage battery device 26 and charge surface 38 of inductive charging device 10. Without foreign object detection unit 12, foreign object 24 is heated to a high degree by the energy transmitted from primary inductive charging unit 18 to secondary inductive charging unit 28 during a charging operation, which means that storage battery device 26 or inductive charging device 10 could be damaged, and/or an operator could be exposed to danger.

Storage battery device 26 and inductive charging device 10 form a system 62.

Figure 3:
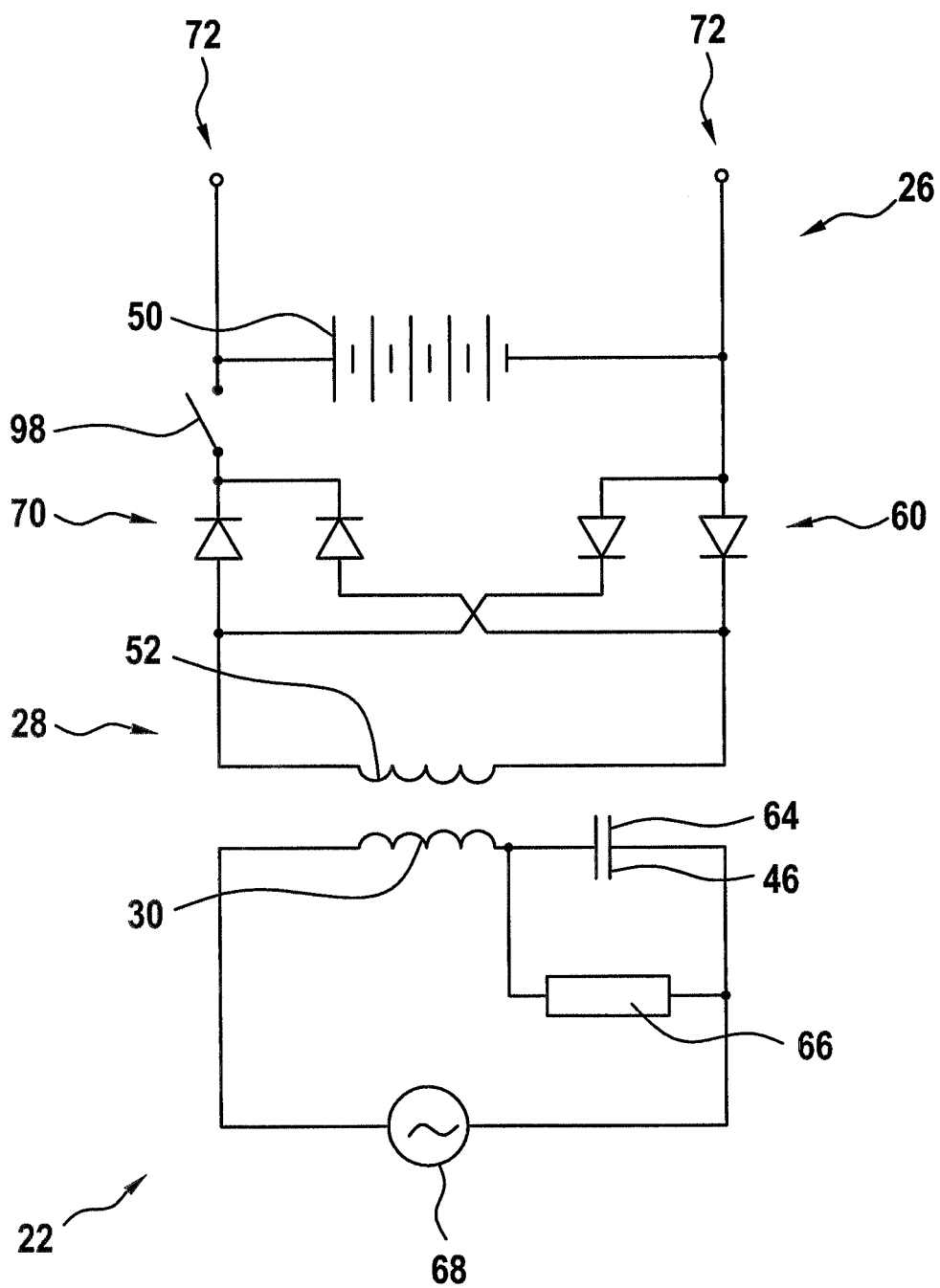
FIG. 3 shows a simplified circuit diagram of an oscillator circuit of an electronic charging unit of the primary inductive charging unit and the storage battery device in a charging operation.

FIG. 3 shows a simplified circuit diagram of oscillator circuit 22 of electronic charging unit 20 of primary inductive charging unit 18 and storage battery device 26 in a charging operation. The circuit diagram of oscillator circuit 22 of electronic charging unit 20 of primary inductive charging unit 18 of inductive charging device 10 includes charge coil 30, a capacitor 64, a resistor 66, and an alternating voltage source 68. Capacitor 64 forms oscillator circuit component 46 of oscillator circuit 22, and charge coil 30 forms an oscillator circuit component as well. Charge coil 30 is switched in series to alternating voltage source 68. Capacitor 64 and resistor 66 are switched in series to charge coil 30 and alternating voltage source 68, capacitor 64 and resistor 66 being switched in parallel with respect to one another. Alternating voltage source 68 is indirectly formed by cable 42. Charge coil 30 and capacitor 64 form an oscillating circuit.

The circuit diagram of storage battery device 26 includes charge coil 52, electronic unit 60, and cell unit 50. Electronic unit 60 of storage battery device 26 includes a rectifier 70. Rectifier 70 is formed by a bridge rectifier. Rectifier 70 is directly connected to charge coil 52 and shaves a voltage arriving at charge coil 52 for smoothing purposes. An output side of rectifier 70 is connected to cell unit 50. Rectifier 70 is connected to cell unit 50 in such a way that charging of cell unit 50 via rectifier 70 is allowed, but discharging is not. A switch 98 is situated between rectifier 70 and cell unit 50. Connections 72 for a handheld machine tool (not shown further) are switched in parallel to cell unit 50.

Charge coil 30 of inductive charging device 10 is disposed in contactless manner opposite charge coil 52 of storage battery device 26.

Processing unit 44 of foreign object detection unit 12 of inductive charging device 10 is able to actuate switch 98 of storage battery device 26 via a communication unit (not shown further). Switch 98 is provided to interrupt a charging operation for a foreign object detection by foreign object detection unit 12 during a charging operation. In the course of a charging operation, switch 98 is opened at regular intervals for a foreign object detection. If a foreign object detection has been concluded without a foreign object 24 having been detected, switch 98 is closed again. However, it would basically also be conceivable that storage battery device 26 opens switch 98 at regular intervals without any signal from foreign object detection unit 12. This could be detected by foreign object detection unit 12 through the dropping energy withdrawal on the part of storage battery device 26, so that a foreign object detection could be initiated.

Figure 4:
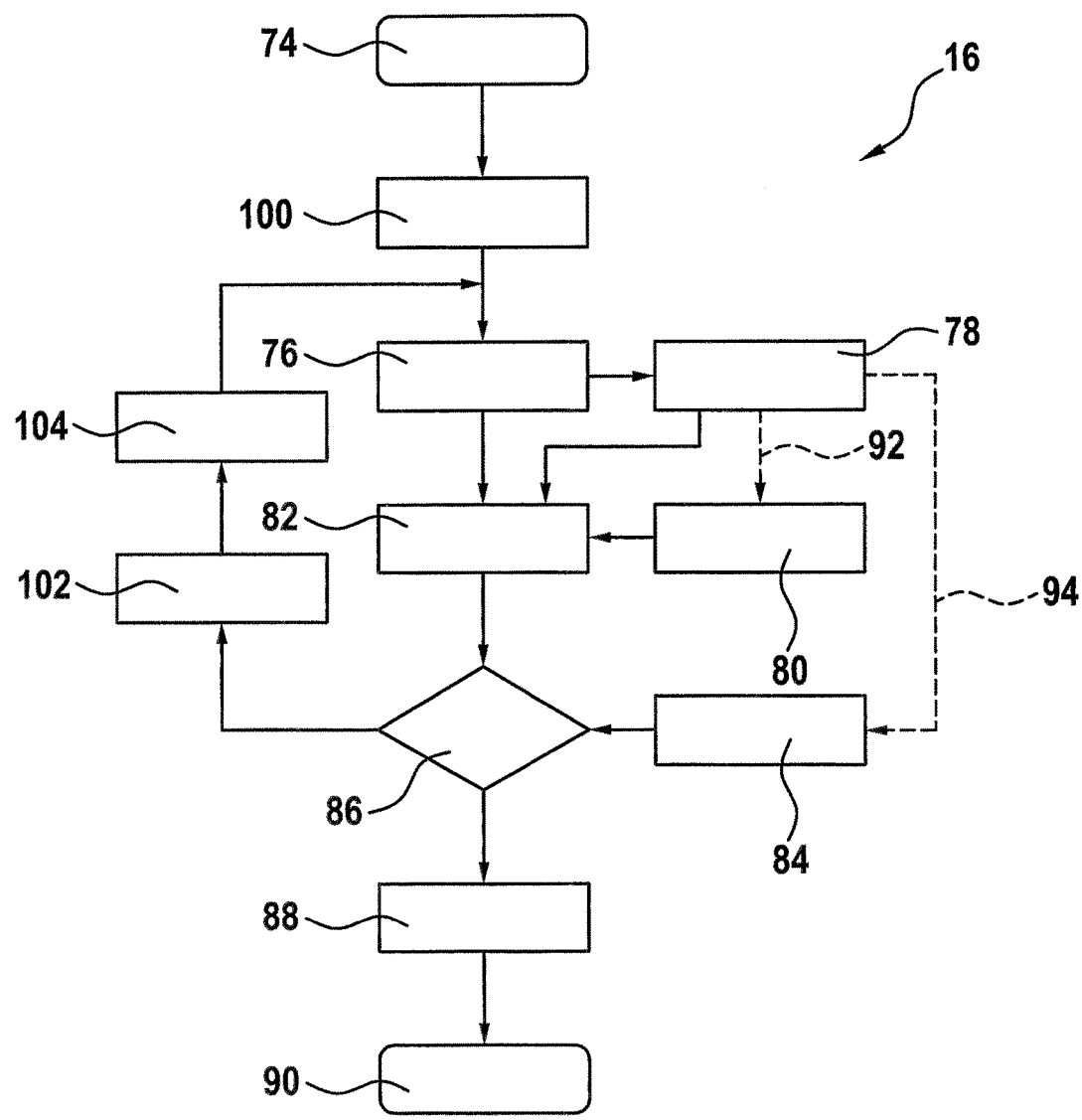
FIG. 4 shows a schematic illustration of a program flow chart of the foreign object detection unit of the inductive charging device in a charging operation.

FIG. 4 shows a program flow chart of foreign object detection unit 12 of inductive charging device 10 in a charging operation. FIG. 4 shows a schematic program sequence of a foreign object detection by processing unit 44 of foreign object detection unit 12. Processing unit 44 of foreign object detection unit 12 executes the program sequence at regular intervals during a charging operation, so that potential foreign objects 24 may be detected. The program sequence starts with a start 74. Following start 74, in a first operation 100, the communication unit (not shown further) outputs a signal to storage battery device 26 for the opening of switch 98 in order to interrupt a charging operation. Following operation 100, in a second operation 76, an actual quality $Q_I$ of oscillator circuit 22 is recorded. Then, in a further operation 78 following operation 76, an actual operating time t recorded by operating time counter 14 is acquired. Parallel thereto, in an operation 80, a setpoint quality $Q_S$ is additionally read out of a memory element (not shown further) of processing unit 44. Setpoint quality $Q_S$ is formed by an original setpoint quality that applies directly, especially in a new state of inductive charging device 10. In an operation 82, a quality differential $\Delta Q_I$ is calculated using actual quality $Q_I$, operating time t, and setpoint quality $Q_S$. For this purpose, operating time t is multiplied by a correction constant k and then added to a differential of actual quality $Q_I$ and setpoint quality $Q_S$. Actual quality $Q_I$ and setpoint quality $Q_S$ are subtracted, actual quantity $Q_I$ forming the minuend. The additional consideration of operating time t with correction constant k is carried out by compensating means 16. Operating time t with correction constant k may also be offset against setpoint quality $Q_S$ already prior to operation 82, as indicated by dashed arrow 92. In addition, as sketched by dashed arrow 94, operating time t with correction constant k may be offset against permissible quality differential $\Delta Q_S$ also only after operation 82. Following operation 82, it is checked in a branching point 86 whether calculated quality differential $\Delta Q_I$ is greater than permissible quality differential $\Delta Q_S$. For this purpose permissible quality differential $\Delta Q_S$ is read out of the memory element (not shown further) of processing unit 44 in an operation 84. In the event that quality differential $\Delta Q_I$ is not greater than permissible quality differential $\Delta Q_S$, the communication unit (not shown further), in a subsequent operation 88, outputs a signal to storage battery device 26 for the closing of switch 98 in order to continue a charging operation. Following operation 88, the program sequence is terminated by a stop 90 and the charging operation is continued in the regular manner. In the event that quality differential $\Delta Q_I$ is greater than permissible quality differential $\Delta Q_S$, an energy transmission to storage battery device 26 is briefly interrupted in a subsequent operation 102, and in a following operation 104, an operator is asked via output element 96 to remove foreign object 24. Then the program sequence is restarted at operation 76.

With increasing operating time t, an average value of actual quality $Q_I$ decreases. Nevertheless, a reliable foreign object detection is able to be achieved because of compensating means 16. A sensitivity of the foreign object detection rises slowly, compensating means 16 notwithstanding, since the average value of actual quality $Q_I$ is likewise decreasing in relation to permissible quality differential $\Delta Q_S$. If the average value of actual quality $Q_I$ reaches a lower limit value, reliable foreign object detection is no longer able to be ensured despite compensating means 16. If this point is detected by foreign object detection unit 12, an operator will be informed of this fact via a light signal of output element 96.

What is claimed is:

1. An inductive charging device for a handheld machine tool storage battery device, comprising:
   a primary inductive charging unit; and
   at least one foreign-object detection unit which includes (i) at least one operating time counter and (ii) at least one compensating unit provided to at least one of set, adapt and calculate at least one foreign-object detection parameter of the foreign-object detection unit as a function of an operating time,
   wherein the primary inductive charging unit has an electronic charging unit which includes at least one oscillator circuit for direct energy transmission,
   wherein the foreign-object detection unit compares a predefined setpoint quality $Q_S$ to an actual quality $Q_I$ of the oscillator circuit,
   wherein the at least one foreign-object detection unit is configured to detect foreign objects that have an adverse effect on a charging process in a charging operation,
   wherein the at least one foreign-object detection unit is situated in a contact region between the inductive charging device and the storage battery device.

2. The inductive charging device as recited in claim 1, wherein the foreign-object detection unit compares a quality differential $\Delta Q_I$, which represents a difference between the setpoint quality $Q_S$ and the actual quality $Q_I$, with a predefined permissible quality differential $\Delta Q_S$.

3. The inductive charging device as recited in claim 1, wherein the compensating unit is configured to at least one of set, adapt and calculate at least one quality parameter of the foreign-object detection unit as a function of an operating time.

4. The inductive charging device as recited in claim 1, wherein the compensating unit is configured to at least one of set, adapt and calculate a setpoint quality $Q_S$ of the foreign-object detection unit as a function of an operating time.

5. The inductive charging device as recited in claim 2, wherein the compensating unit is configured to at least one of set, adapt and calculate a permissible quality differential $\Delta Q_S$ of the foreign-object detection unit as a function of an operating time.

6. A method for detecting a foreign object, comprising:
   providing a foreign-object detection unit of an inductive charging device, the inductive charging device including an electronic charging unit which has at least one oscillator circuit for direct energy transmission, wherein foreign-object detection unit which includes (i) at least one operating time counter and (ii) at least one compensating unit provided to at least one of set, adapt and calculate at least one foreign-object detection parameter of the foreign-object detection unit as a function of an operating time; and
   comparing a quality differential $\Delta Q_I$, which represents a difference between a setpoint quality $Q_S$ and an actual quality $Q_I$ of the oscillator circuit, with a predefined permissible quality differential $\Delta Q_S$,
   wherein the foreign-object detection unit is configured to detect foreign objects that have an adverse effect on a charging process in a charging operation, wherein the foreign-object detection unit is situated in an environment of the inductive charging device.

7. A battery system, comprising:
a storage battery device; and
an inductive charging device for the storage battery device, the inductive charging device including:
  a primary inductive charging unit, wherein the primary inductive charging unit has an electronic charging unit which includes at least one oscillator circuit for direct energy transmission; and
  at least one foreign-object detection unit which includes (i) at least one operating time counter and (ii) at least one compensating unit provided to at least one of set, adapt and calculate at least one foreign-object detection parameter of the foreign-object detection unit as a function of an operating time,
wherein the primary inductive charging unit has an electronic charging unit which includes at least one oscillator circuit for direct energy transmission,
wherein the foreign-object detection unit compares a predefined setpoint quality $Q_S$ to an actual quality $Q_I$ of the oscillator circuit,
wherein the at least one foreign-object detection unit is configured to detect foreign objects that have an adverse effect on a charging process in a charging operation,
wherein the at least one foreign-object detection unit is situated in a contact region between the inductive charging device and the storage battery device.

* * * * *